United States Patent
Suzuki et al.

(10) Patent No.: US 10,432,165 B2
(45) Date of Patent: Oct. 1, 2019

(54) BALANCED/UNBALANCED CONVERTER

(71) Applicant: TDK CORPORATION, Tokyo (JP)

(72) Inventors: Hiroya Suzuki, Tokyo (JP); Noriaki Ootsuka, Tokyo (JP); Yuta Ashida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 42 days.

(21) Appl. No.: 15/842,226

(22) Filed: Dec. 14, 2017

(65) Prior Publication Data
US 2018/0175820 A1    Jun. 21, 2018

(30) Foreign Application Priority Data
Dec. 15, 2016   (JP) .................. 2016-243566

(51) Int. Cl.
*H03H 7/42*   (2006.01)
*H01P 5/10*   (2006.01)

(52) U.S. Cl.
CPC ............... *H03H 7/42* (2013.01); *H01P 5/10* (2013.01)

(58) Field of Classification Search
CPC .................................... H03H 7/42; H01P 5/10
USPC ........................................................ 333/25
See application file for complete search history.

(56) References Cited

U.S. PATENT DOCUMENTS

| | | | | |
|---|---|---|---|---|
| 5,497,137 A * | 3/1996 | Fujiki | ................ | H01F 17/0006 333/26 |
| 6,097,273 A * | 8/2000 | Frye | ................ | H01F 5/003 333/25 |
| 6,285,273 B1 * | 9/2001 | Morikawa | ................ | H01P 5/10 333/26 |
| 6,483,415 B1 * | 11/2002 | Tang | ................ | H01F 17/0013 333/26 |
| 6,515,556 B1 * | 2/2003 | Kato | ................ | H01P 5/10 333/116 |
| 6,628,189 B2 * | 9/2003 | Yazaki | ................ | H01F 17/0013 333/25 |
| 8,154,360 B2 * | 4/2012 | Uemichi | ................ | H01L 23/49822 333/238 |
| 9,350,316 B1 * | 5/2016 | Krehbiel | ................ | H03H 7/42 |

FOREIGN PATENT DOCUMENTS

JP   2000-188218 A   7/2000

* cited by examiner

*Primary Examiner* — Dean O Takaoka
(74) *Attorney, Agent, or Firm* — Oliff PLC

(57) ABSTRACT

Provided is a balanced/unbalanced converter (1) that includes a first strip line (40), a second strip line (41), a third strip line (42), a fourth strip line (43), an unbalanced terminal (4), and an open terminal (7). The first strip line (40) includes a spiral first conductor (19), and the second strip line (41) includes a spiral second conductor (14). An outer circumferential end (19*b*) of the first conductor (19) is electrically connected to the unbalanced terminal (4), and an outer circumferential end (14*a*) of the second conductor (14) is electrically connected to the open terminal (7).

4 Claims, 4 Drawing Sheets

BALANCED/UNBALANCED CONVERTER

TECHNICAL FIELD

The present invention relates to a balanced/unbalanced converter.

BACKGROUND

As a conventional balanced/unbalanced converter, for instance a balanced/unbalanced converter described in Patent Literature 1 (Japanese Unexamined Patent Publication No. 2000-188218) is known. The conventional balanced/unbalanced converter described in Patent Literature 1 includes a first strip line, a second strip line, a third strip line that is electromagnetically coupled with the first strip line, and a fourth strip line that is electromagnetically coupled with the second strip line. One end of the first strip line is electrically connected to an unbalanced terminal, and the other end of the first strip line is electrically connected to one end of the second strip line. The other end of the second strip line is open.

SUMMARY

One cause of failure occurring in the balanced/unbalanced converter is disconnection of the strip line. When the balanced/unbalanced converter is configured as a chip part, the disconnection of the strip line cannot be observed. For this reason, a disconnection inspection in which a current is applied can be considered as a solution for finding a failure. However, in the conventional balanced/unbalanced converter, since the other end of the second strip line is open, it is impossible to perform a disconnection inspection of the first strip line and the second strip line. To perform a disconnection inspection, the other end of the second strip line needs to be electrically connected to a terminal. However, a structure involved in electrically connecting the other end of the second strip line and the terminal in the conventional balanced/unbalanced converter is complicated.

An aspect of the present invention is directed to providing a balanced/unbalanced converter on which a disconnection inspection can be performed with a simple configuration.

A balanced/unbalanced converter according to an aspect of the present invention includes: a first strip line; a second strip line; a third strip line electromagnetically coupled with the first strip line; a fourth strip line electromagnetically coupled with the second strip line; an unbalanced terminal electrically connected to one end of the first strip line; and an open terminal electrically connected to one end of the second strip line. The other end of the first strip line and the other end of the second strip line are electrically connected. The first strip line includes a spiral first conductor, and the second strip line includes a spiral second conductor. An outer circumferential end of the first conductor is electrically connected to the unbalanced terminal, and an outer circumferential end of the second conductor is electrically connected to the open terminal.

In the balanced/unbalanced converter according to an aspect of the present invention, since the outer circumferential end of the second conductor is electrically connected to the open terminal, a disconnection inspection can be performed. The outer circumferential end of the first conductor is electrically connected to the unbalanced terminal, and the outer circumferential end of the second conductor is electrically connected to the open terminal. In this way, since the outer circumferential ends of the conductors are connected to the terminals, connection between each of the conductors and each of the terminals can be realized in a simple structure, compared to, for instance, when the inner circumferential end and the terminals are connected. Therefore, in the balanced/unbalanced converter, the disconnection inspection can be performed in a simple configuration.

In an embodiment, the first conductor and the second conductor may be opposite in winding direction to each other when one of the outer circumferential ends is set as a start point. When the first strip line and the second strip line are electromagnetically coupled, characteristics may deteriorate. In the embodiment, since the winding direction of the first conductor and the winding direction of the second conductor are opposite to each other, the first strip line and the second strip line can be inhibited from being electromagnetically coupled. Thereby, the deterioration of the characteristics of the balanced/unbalanced converter can be suppressed.

In an embodiment, each of the first conductor and the second conductor may include a plurality of conductors. In this configuration, since the number of turns of the conductor can be secured as a whole by the plurality of conductors, the number of turns in one conductor can be reduced. Thereby, the configuration of each conductor is simplified. Therefore, since line-and-space restriction is relaxed, the conductors can be easily formed.

In an embodiment, the balanced/unbalanced converter may further include: a first balanced terminal electrically connected to one end of the third strip line; a second balanced terminal electrically connected to one end of the fourth strip line; and two ground terminals. The first strip line, the second strip line, the third strip line, and the fourth strip line may be arranged inside an element assembly having a mounting face. The unbalanced terminal, the ground terminal, and the first balanced terminal may be arranged on the mounting face in a first direction of the mounting face in this order, and the unbalanced terminal and the open terminal, the ground terminal and the ground terminal, and the first balanced terminal and the second balanced terminal may be arranged on the mounting face side by side in a second direction perpendicular to the first direction. In this configuration, the outer circumferential end of the first conductor is connected to the unbalanced terminal, and the outer circumferential end of the second conductor is connected to the open terminal. Thereby, the connection between each of the conductors and each of the terminals can be realized in a simple structure. Especially, when the winding direction of the first conductor and the winding direction of the second conductor are opposite directions, it is effective to arrange the terminals based on a relation between the numbers of turns of the conductors in order to simplify the configuration.

According to an aspect of the present invention, a disconnection inspection can be performed with a simple configuration.

DETAILED DESCRIPTION

Hereinafter, a preferred embodiment of the present invention will be described in detail with reference to the attached drawings. In the description of the drawings, identical or equivalent elements are given the same reference signs, and duplicate description thereof will be omitted.

Figure 1:
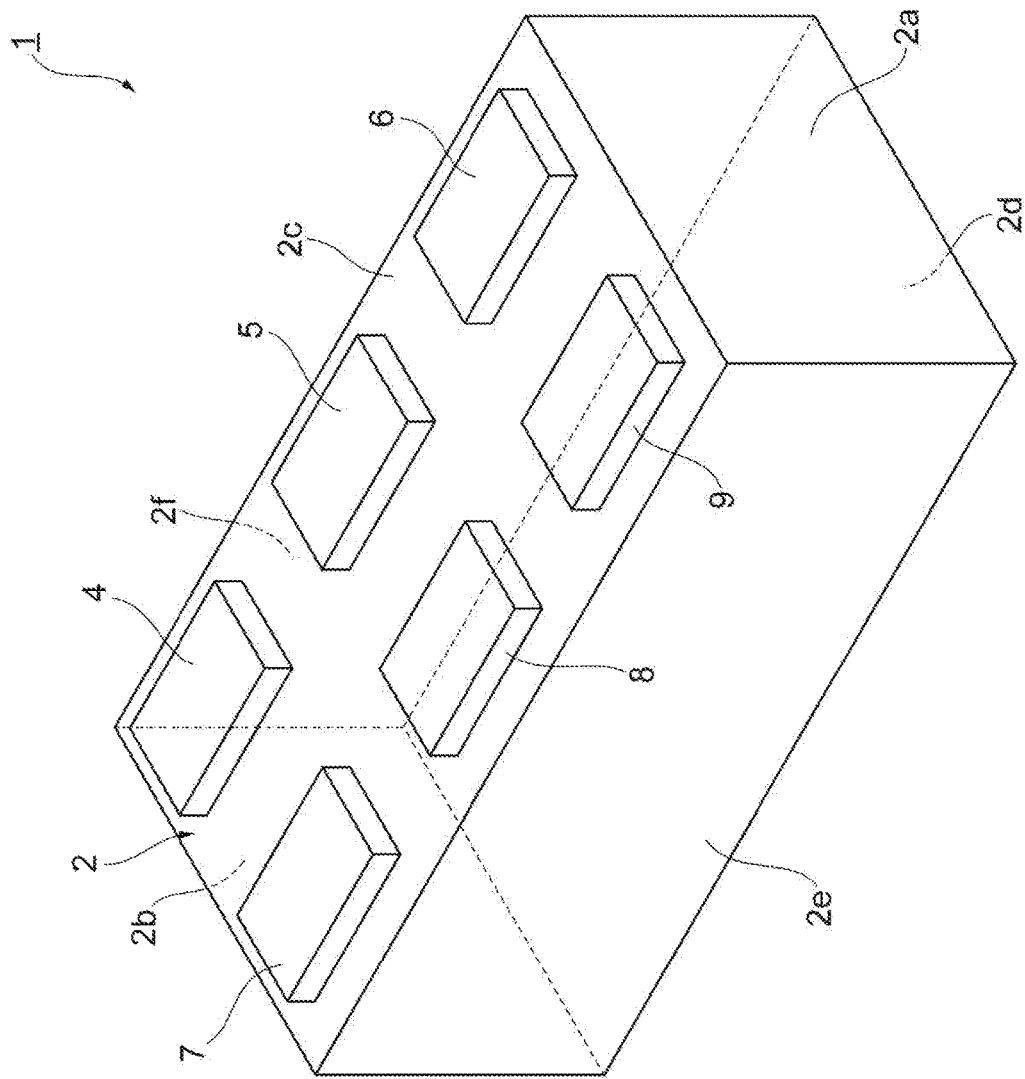
FIG. 1 is a perspective view illustrating a laminated balun according to an embodiment.

As illustrated in FIG. 1, a laminated balun (a balanced/unbalanced converter) 1 includes an element assembly 2, a first terminal electrode 4, a second terminal electrode 5, a third terminal electrode 6, a fourth terminal electrode 7, a fifth terminal electrode 8, and a sixth terminal electrode 9.

The element assembly 2 has a cuboidal shape. The element assembly 2 has, as outer surfaces thereof, a pair of opposite end faces 2a and 2b, a pair of opposite principal faces 2c and 2d that extend to connect the pair of end faces 2a and 2b, and a pair of opposite lateral faces 2e and 2f that extend to connect the pair of principal faces 2c and 2d. For example, when the laminated balun 1 is mounted on another electronic device (e.g., a circuit board, an electronic part, etc.) (not shown), the principal face 2c is specified as a mounting face that faces the other electronic device.

The direction between the end faces 2a and 2b, the direction between the principal faces 2c and 2d, and the direction between the lateral faces 2e and 2f are approximately orthogonal to one another. The cuboidal shape includes the shape of a rectangular parallelepiped in which corners and edges are chamfered, and the shape of a rectangular parallelepiped in which corners and edges are rounded.

A plurality of insulator layers 10 (see FIG. 2) are laminated to constitute the element assembly 2. The insulator layers 10 are laminated in the direction between the principal faces 2c and 2d of the element assembly 2. That is, the laminating direction of the insulator layers 10 is identical to the direction between the principal faces 2c and 2d of the element assembly 2. Hereinafter, the direction between the principal faces 2c and 2d is referred to as the "laminating direction." Each of the insulator layers 10 has an approximately rectangular shape. In the actual element assembly 2, the insulator layers 10 are integrated to such a degree that boundaries between the insulator layers cannot be observed.

Each of the insulator layers 10 is formed of a sintered compact of a ceramic green sheet containing, for instance, a dielectric material (a $BaTiO_3$-based material, a $Ba(Ti,Zr)O_3$-based material, a $(Ba, Ca)TiO_3$-based material, a glass material, or an alumina material). In the actual element assembly 2, the insulator layers 10 are integrated to such a degree that boundaries between the insulator layers cannot be observed.

The terminal electrodes 4 to 9 are arranged on the principal face 2c of the element assembly 2. Each of the terminal electrodes 4 to 9 has an approximately rectangular shape in a top view. The first terminal electrode 4, the second terminal electrode 5, and the third terminal electrode 6 are arranged at prescribed intervals in a first direction of the principal face 2c (in the direction between the pair of end faces 2a and 2b). The fourth terminal electrode 7, the fifth terminal electrode 8, and the sixth terminal electrode 9 are arranged at prescribed intervals in the first direction of the principal face 2c. The first terminal electrode 4 and the fourth terminal electrode 7 are arranged side by side at a prescribed interval in a second direction of the principal face 2c (in the direction between the pair of lateral faces 2e and 2f, or in a direction perpendicular to the first direction). The second terminal electrode 5 and the fifth terminal electrode 8 are arranged side by side at a prescribed interval in the second direction of the principal face 2c. The third terminal electrode 6 and the sixth terminal electrode 9 are arranged side by side at a prescribed interval in the second direction of the principal face 2c.

Each of the terminal electrodes 4 to 9 contains a conductive material (e.g., Ag or Pd). Each of the terminal electrodes 4 to 9 is formed as a sintered compact of a conductive paste containing a conductive material (e.g., Ag powder or Pd powder). A plated layer is formed on a surface of each of the terminal electrodes 4 to 9. The plated layer is formed by, for instance, electroplating. The plated layer has a layered structure made up of a Cu plated layer, a Ni plated layer, and a Sn plated layer, or a layered structure made up of a Ni plated layer and a Sn plated layer.

Figure 2:
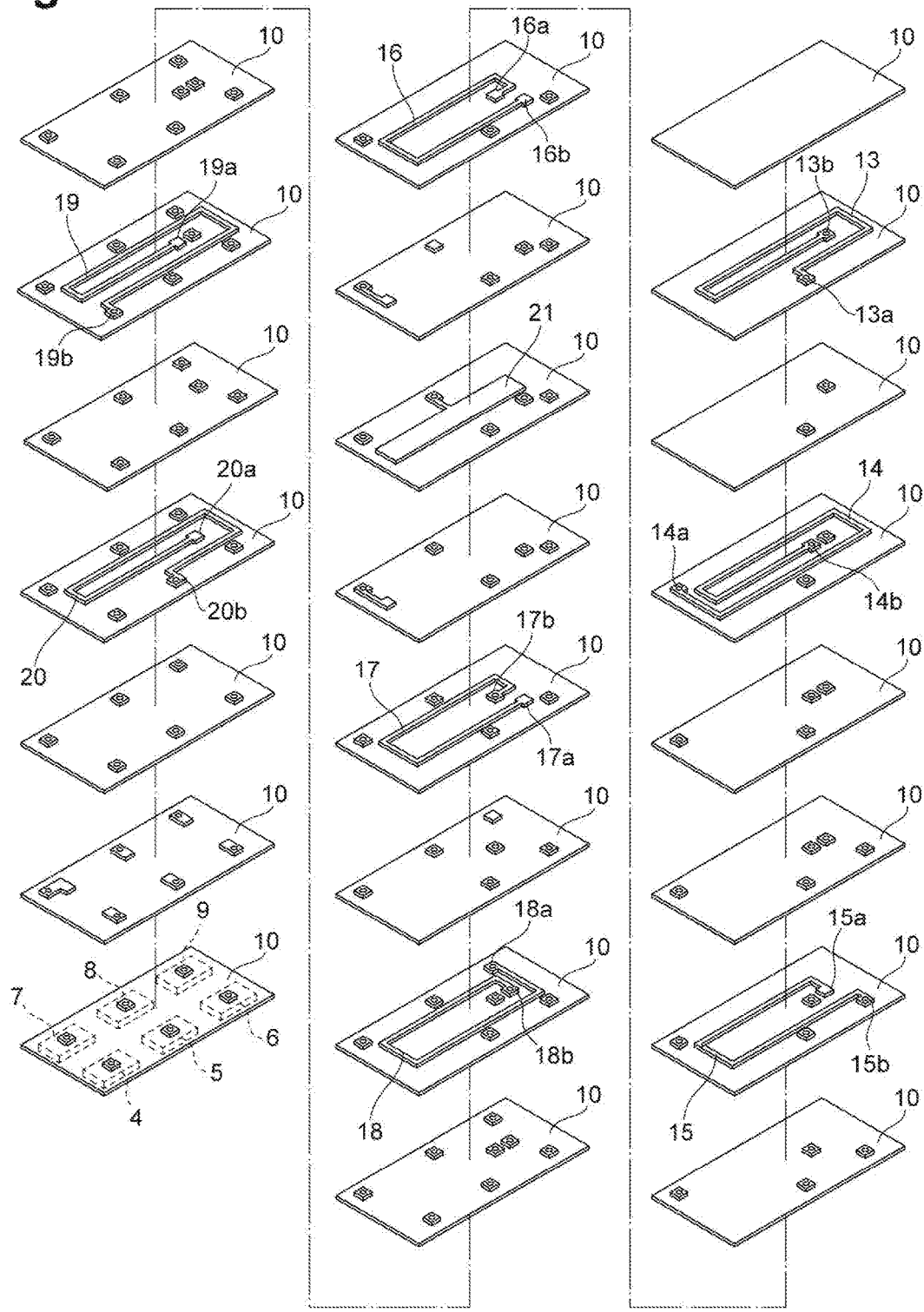
FIG. 2 is an exploded perspective view of an element assembly.
Figure 3:
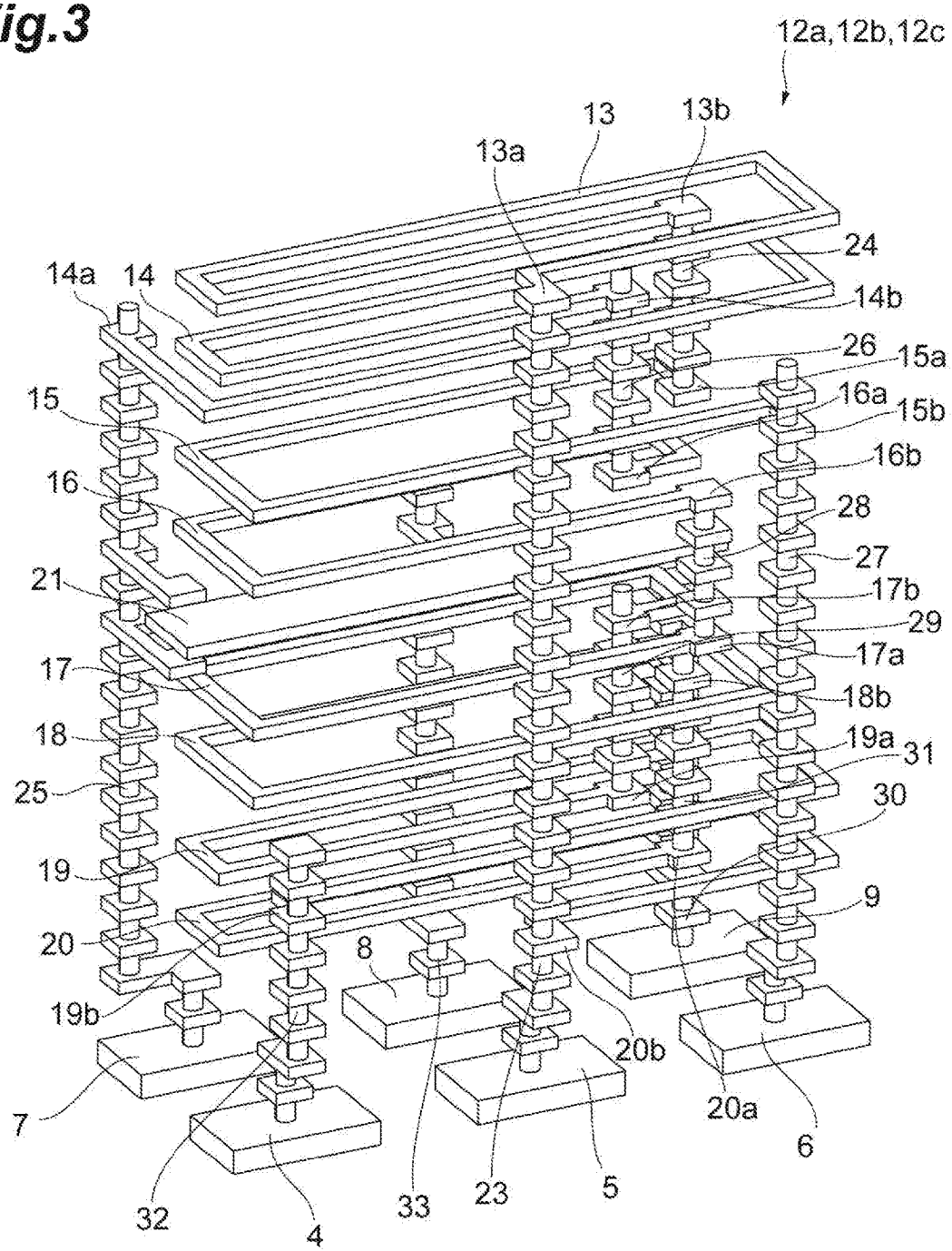
FIG. 3 is a perspective view illustrating a configuration inside the element assembly.

As illustrated in FIG. 3, the laminated balun 1 includes first, second and third lines 12a, 12b and 12c, and an internal electrode 21 which are arranged inside the element assembly 2. As illustrated in FIGS. 2 and 3, the first line 12a includes a conductor 13 and a conductor 15. The second line 12b includes a conductor 18 and a conductor 20. The third line 12c includes a conductor (a second conductor) 14, a conductor 16, a conductor 17, and a conductor (a first conductor) 19. Each of the conductors 13 to 20 has a spiral shape in a top view. That is, the conductors 13 to 20 are planar spiral conductors.

The plurality of conductors 13 to 20 and the internal electrode 21 are formed with, for instance, Ag or Pd, or a combination thereof contained as a conductive material. Each of the plurality of conductors 13 to 20 and the internal electrode 21 is formed as a sintered compact of a conductive paste that contains Ag or Pd, or a combination thereof as a conductive material.

One end 13a of the conductor 13 is electrically connected to the second terminal electrode 5 by a through-hole conductor 23. The other end 13b of the conductor 13 is electrically connected to one end 15a of the conductor 15 by a through-hole conductor 24. One end 14a of the conductor 14 is electrically connected to the fourth terminal electrode 7 by a through-hole conductor 25. The other end 14b of the conductor 14 is electrically connected to one end 16a of the conductor 16 by a through-hole conductor 26.

The other end 15b of the conductor 15 is electrically connected to the third terminal electrode 6 by a through-hole conductor 27. The other end 16b of the conductor 16 is electrically connected to one end 17a of the conductor 17 by a through-hole conductor 28.

The other end 17b of the conductor 17 is electrically connected to one end 19a of the conductor 19 by a through-hole conductor 29. One end 18a of the conductor 18 is electrically connected to the sixth terminal electrode 9 by a through-hole conductor 30. The other end 18b of the conductor 18 is electrically connected to one end 20a of the conductor 20 by a through-hole conductor 31.

The other end 19b of the conductor 19 is electrically connected to the first terminal electrode 4 by a through-hole conductor 32. The other end 20b of the conductor 20 is electrically connected to the second terminal electrode 5 by the through-hole conductor 23.

One end of the first line 12a is electrically connected to the second terminal electrode 5. The other end of the first line 12a is electrically connected to the third terminal electrode 6. One end of the second line 12b is electrically connected to the sixth terminal electrode 9. The other end of the second line 12b is electrically connected to the third terminal electrode 6. One end of the third line 12c is electrically connected to the first terminal electrode 4, and the other end of the third line 12c is electrically connected to the fourth terminal electrode 7.

The internal electrode 21 has a rectangular shape. The internal electrode 21 is electrically connected to the fifth terminal electrode 8 by a through-hole conductor 33.

Figure 4:
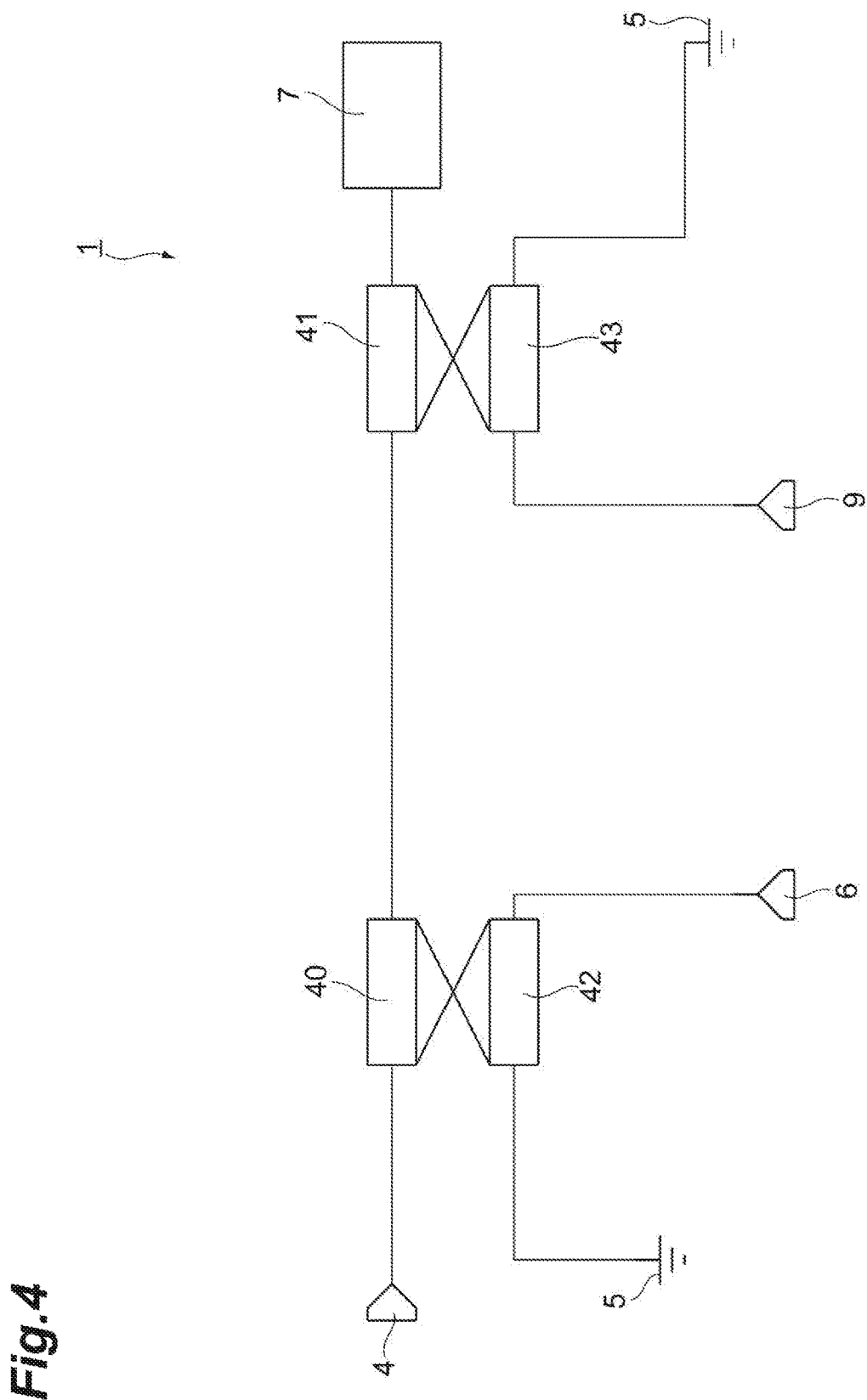
FIG. 4 is an equivalent circuit schematic of the laminated balun.

FIG. 4 is an equivalent circuit schematic of the laminated balun 1 having the above configuration. As illustrated in FIG. 4, the laminated balun 1 includes a first strip line 40, a second strip line 41, a third strip line 42, and a fourth strip line 43. Each of the first strip line 40, the second strip line 41, the third strip line 42, and the fourth strip line 43 is a strip line of a ¼ wavelength. The first strip line 40 and the third strip line 42 are electromagnetically coupled. The second strip line 41 and the fourth strip line 43 are electromagnetically coupled. The laminated balun 1 converts electrical signals that are in balanced and unbalanced states.

The first strip line 40 is made up of the conductor 17 and the conductor 19 illustrated in FIGS. 2 and 3. The second strip line 41 is made up of the conductor 14 and the conductor 16. The third strip line 42 is made up of the conductor 18 and the conductor 20. The fourth strip line 43 is made up of the conductor 13 and the conductor 15.

The first terminal electrode 4 forms an unbalanced terminal. The second terminal electrode 5 forms a ground terminal. The third terminal electrode 6 forms a balanced terminal. The fourth terminal electrode 7 forms an open terminal. The fifth terminal electrode 8 forms a ground terminal. The sixth terminal electrode 9 forms a balanced terminal. Thereby, in the present embodiment, as illustrated in FIG. 1, the unbalanced terminal, the ground terminal, and the first balanced terminal are arranged on the principal face 2c of the element assembly 2 in the first direction of the principal face 2c in that order. The unbalanced terminal and the open terminal, the ground terminal and the ground terminal, and the first balanced terminal and the second balanced terminal are arranged on the principal face 2c of the element assembly 2 side by side in the second direction perpendicular to the first direction.

One end of the first strip line 40 is electrically connected to the unbalanced terminal (the first terminal electrode 4). One end of the second strip line 41 is electrically connected to the open terminal (the fourth terminal electrode 7). The other end of the first strip line 40 and the other end of the second strip line 41 are electrically connected (by the through-hole conductor 28). One end of the third strip line 42 is electrically connected to the balanced terminal (the third terminal electrode 6). The other end of the third strip line 42 is electrically connected to the ground terminal (the second terminal electrode 5). One end of the fourth strip line 43 is electrically connected to the balanced terminal (the sixth terminal electrode 9). The other end of the fourth strip line 43 is electrically connected to the ground terminal (the second terminal electrode 5).

As illustrated in FIG. 2, the other end 19b of the conductor 19 constituting the first strip line 40 is an outer circumferential end (the one end 19a is an inner circumferential end). The outer circumferential end is an end located outside the wound conductor. The other end 19b of the conductor 19 is disposed at a position facing the first terminal electrode 4 in the direction between the pair of principal faces 2c and 2d. The one end 14a of the conductor 14 constituting the second strip line 41 is an outer circumferential end (the other end 14b is an inner circumferential end). The one end 14a of the conductor 14 is disposed at a position facing the fourth terminal electrode 7 in the direction between the pair of principal faces 2c and 2d.

Winding directions of the conductor 17 and the conductor 19 that constitute the first strip line 40 are opposite to those of the conductor 14 and the conductor 16 that constitute the second strip line 41. To be specific, in the present embodiment, when the element assembly 2 is viewed from the principal face 2c side, in the case in which the other end 19b of the conductor 19 is set as a start point and in which the one end 14a of the conductor 14 is set as an end point, the conductor 17 and the conductor 19 are counterclockwise, and the conductor 14 and the conductor 16 are clockwise.

As described above, in the laminated balun 1 according to the present embodiment, since the one end 14a that is the outer circumferential end of the conductor 14 is electrically connected to the fourth terminal electrode 7 (the open terminal), a disconnection inspection (detection of RDC characteristics) can be performed. In the laminated balun 1, the other end 19b that is the outer circumferential end of the conductor 19 is electrically connected to the first terminal electrode 4 (the unbalanced terminal). In this way, since the outer circumferential ends 14a and 19b of the conductors 14 and 19 are connected to the terminal electrodes 7 and 4, connection between the conductors 14 and 19 and between the terminal electrodes 7 and 4 can be realized in a simple structure, compared to when the inner circumferential ends and the terminals are connected.

In the present embodiment, the one end 14a that is the outer circumferential end of the conductor 14 is electrically connected to the fourth terminal electrode 7 by the through-hole conductor 25 that extends in the laminating direction of the element assembly 2 in an approximately linear fashion. The other end 19b that is the outer circumferential end of the conductor 19 is electrically connected to the first terminal electrode 4 by the through-hole conductor 31 that extends in the laminating direction of the element assembly 2 in an approximately linear fashion. In this way, in the laminated balun 1, the connection is realized in a simple structure in which the through-hole conductors are extended in the laminating direction. Therefore, in the laminated balun 1, the disconnection inspection can be performed in a simple configuration.

In the laminated balun 1 according to the present embodiment, when one of the outer circumferential ends 14a and 19b is set as a start point, the conductors 17 and 19 may be opposite in winding direction to the conductors 14 and 16. When the first strip line 40 and the second strip line 41 are electromagnetically coupled, characteristics deteriorate. In the laminated balun 1, since the winding directions of the conductors 17 and 19 are opposite to those of the conductors 14 and 16, the first strip line 40 and the second strip line 41 can be inhibited from being electromagnetically coupled. Thereby, the deterioration of the characteristics of the laminated balun 1 can be suppressed.

In the laminated balun 1 according to the present embodiment, the first strip line 40 is constituted of the two conductors 17 and 19, and the second strip line 41 is constituted of the two conductors 14 and 16. In this configuration, since the number of turns in a coil can be secured by the two conductors 17 and 19, the number of turns in one conductor can be reduced. Thereby, the configuration of the conductor is simplified. Therefore, since line-and-space restriction is relaxed, the conductor can be easily formed.

The laminated balun 1 according to the present embodiment includes the third terminal electrode 6 (the first balanced terminal) that is electrically connected to the one end of the third strip line 42, the sixth terminal electrode 9 (the second balanced terminal) that is electrically connected to the one end of the fourth strip line 43, and the second and fifth terminal electrodes 5 and 8 (the two ground terminals). The first terminal electrode 4, the second terminal electrode 5, and the third terminal electrode 6 are arranged on the principal face 2d of the element assembly 2 in the first direction in that order, and the first terminal electrode 4 and the fourth terminal electrode 7, the second terminal electrode 5 and the fifth terminal electrode 8, and the third terminal electrode 6 and the sixth terminal electrode 9 are arranged on the principal face 2d of the element assembly 2 side by side in the second direction perpendicular to the first direction. In this configuration, the outer circumferential end 19b of the conductor 19 is connected to the first terminal electrode 4, and the outer circumferential end 14a of the conductor 14 is connected to the fourth terminal electrode 7. Thereby, the connection between the conductors 14 and 19 and between the terminal electrodes 7 and 4 can be realized in a simple structure. Especially, when the winding directions of the conductors 17 and 19 are opposite to those of the conductors 14 and 16, it is effective to arrange the terminals based on a relation between the number of turns of the conductors 17 and 19 and the number of turns of the conductors 14 and 16 in order to simplify the configuration.

While an embodiment of the present invention has been described, the present invention is not necessarily limited to the embodiment, and can be variously modified without departing from the scope of the present invention.

In the above embodiment, the mode in which the first strip line 40 is constituted of the conductor 17 and the conductor 19 has been described by way of example. However, the first strip line may be constituted of one conductor, or three or more conductors. This is also true of the second strip line 41, the third strip line 42, and the fourth strip line 43.

In the above embodiment, the mode in which the winding directions of the conductor 17 and the conductor 19 constituting the first strip line 40 and the winding directions of the conductor 14 and the conductor 16 constituting the second strip line 41 are opposite directions (reverse winding) has been described by way of example. However, the winding directions of the conductor 17 and the conductor 19 and the winding directions of the conductor 14 and the conductor 16 may be the same direction.

In the above embodiment, the mode in which the one end 14a of the conductor 14 is electrically connected to the fourth terminal electrode 7 (the open terminal) by the through-hole conductor 25 has been described by way of example. However, the conductor 14 and the fourth terminal electrode 7 may be electrically connected by, for instance, the through-hole conductor that extends from the one end 14a of the conductor 14 to the principal face 2c side.

In the above embodiment, the mode in which the terminal electrodes 4 to 6 are arranged on the lateral face 2e and the principal faces 2c and 2d and the terminal electrodes 7 to 9 are arranged on the lateral face 2f and the principal faces 2c and 2d has been described by way of example. However, shapes (arrangement modes) of the terminal electrodes 4 to 9 are not limited to this.

What is claimed is:

1. A balanced/unbalanced converter comprising:
   an element assembly;
   a first strip line disposed in the element assembly;
   a second strip line disposed in the element assembly;
   a third strip line disposed in the element assembly and electromagnetically coupled with the first strip line;
   a fourth strip line disposed in the element assembly and electromagnetically coupled with the second strip line;
   an unbalanced terminal disposed on an outer surface of the element assembly and electrically connected to one end of the first strip line; and
   an open terminal disposed on the outer surface of the element assembly and electrically connected to one end of the second strip line,
   wherein another end of the first strip line and another end of the second strip line are electrically connected,
   the first strip line includes a spiral first conductor,
   the second strip line includes a spiral second conductor,
   an outer circumferential end of the first conductor is electrically connected to the unbalanced terminal, and
   an outer circumferential end of the second conductor is electrically connected to the open terminal.

2. The balanced/unbalanced converter according to claim 1, wherein the first conductor and the second conductor are opposite in winding direction to each other when one of the outer circumferential ends is set as a start point.

3. The balanced/unbalanced converter according to claim 1, wherein each of the first conductor and the second conductor includes a plurality of conductors.

4. The balanced/unbalanced converter according to claim 1, further comprising:
   a first balanced terminal disposed on the outer surface of the element assembly and electrically connected to one end of the third strip line;
   a second balanced terminal disposed on the outer surface of the element assembly and electrically connected to one end of the fourth strip line; and
   two ground terminals disposed on the outer surface of the element assembly,
   wherein one face of the outer surface of the element assembly is defined as a mounting face, and
   the unbalanced terminal, the ground terminal, and the first balanced terminal are arranged on the mounting face in a first direction of the mounting face in that order, and the unbalanced terminal and the open terminal, the ground terminal and the ground terminal, and the first balanced terminal and the second balanced terminal are arranged on the mounting face side by side in a second direction perpendicular to the first direction.

* * * * *